United States Patent [19]

Avenel et al.

[11] 4,424,137

[45] Jan. 3, 1984

[54] ACRYLIC PREPOLYMER AND PROCESS FOR ENCAPSULATION OF PHOTOCELLS

[75] Inventors: Michel Avenel, Gisors; Paul Evrard, Fourqueux; Jean-Paul Leca, Mantes la Jolie, all of France

[73] Assignee: Societe Chimique des Charbonnages—CdF Chimie, Paris la Defense, France

[21] Appl. No.: 354,922

[22] Filed: Mar. 5, 1982

[30] Foreign Application Priority Data

Mar. 5, 1981 [FR] France ................................ 81 04392

[51] Int. Cl.³ .................... C08F 120/06; C08F 20/10; C08F 120/10
[52] U.S. Cl. ................................ 252/182; 526/328; 526/328.5; 526/329.7; 560/205
[58] Field of Search ............. 252/182; 526/328, 328.5, 526/329.7; 560/205

[56] References Cited

U.S. PATENT DOCUMENTS

| | | | |
|---|---|---|---|
| 4,175,176 | 11/1979 | Ozawa | 526/309 |
| 4,246,382 | 1/1981 | Honda et al. | 526/328.5 |
| 4,276,432 | 6/1981 | Rhum et al. | 526/328 |
| 4,377,679 | 3/1983 | Schmidlp | 252/182 |

FOREIGN PATENT DOCUMENTS 2394895 1/1979 France.
1033008 6/1966 United Kingdom.

*Primary Examiner*—Irwin Gluck
*Attorney, Agent, or Firm*—Finnegan, Henderson, Farabow, Garrett & Dunner

[57] ABSTRACT

Acrylic prepolymer comprising:

from 10 to 50% by weight of units derived from at least one alkyl acrylate, the alkyl group having from 4 to 12 carbon atoms, from 30 to 60% by weight of units derived from at least one alkyl methacrylate, the alkyl group having from 1 to 5 carbon atoms, and from 10 to 40% by weight of units derived from methyl acrylate.

The prepolymer is used to encapsulate photocells, connected to one another by conducting wires and positioned on a support plate, by casting a resin into the space located between the support plate and a second protective plate, the resin being obtained by mixing 100 parts of the acrylic prepolymer, from 0.1 to 4 parts of a vanadium arenesulphonate and from 0.5 to 4 parts of a free-radical initiator, at a temperature between 10° and 70° C. and for a sufficient time to solidify the polymeric resin at the temperature selected.

6 Claims, No Drawings

ACRYLIC PREPOLYMER AND PROCESS FOR ENCAPSULATION OF PHOTOCELLS

BACKGROUND OF THE INVENTION

The present invention relates to an acrylic prepolymer and its use for encapsulating photocells.

A problem encountered in the manufacture of panels for utilizing solar energy, referred to as solar panels, concerns the encapsulation of the photocells supplying the panels. A material that is transparent, flexible, and very resistant to aging under the action of heat and/or moisture is needed for this purpose.

SUMMARY OF THE INVENTION

The present invention overcomes this problem with an acrylic prepolymer that has proved effective for the encapsulation of photocells, as described in detail below.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the foregoing objects and in accordance with the purpose of the invention, as embodied and broadly described herein, the acrylic prepolymer of the invention comprises:

from 10 to 50% by weight of units derived from at least one alkyl acrylate, the alkyl group having from 4 to 12 carbon atoms, from 30 to 60% by weight of units derived from at least one alkyl methacrylate, the alkyl group having from 1 to 5 carbon atoms, and from 10 to 40% by weight of units derived from methyl acrylate.

Further to achieve the foregoing objects and in accordance with the purpose of the invention, as embodied and broadly described herein, the invention comprises a process for the manufacture of the above-described acrylic prepolymer, comprising copolymerizing (a) from 10 to 50% by weight of at least one alkyl acrylate, the alkyl group having from 4 to 12 carbon atoms, (b) from 30 to 60% by weight of at least one alkyl methacrylate, the alkyl group having from 1 to 5 carbon atoms, and (c) from 10 to 40% by weight of methyl acrylate. Copolymerization is carried out in the presence of a free-radical initiator and a chain transfer agent, at a temperature between 60° and 85° C., until a viscosity between 1.5 and 10 poises is obtained.

Further to achieve the foregoing objects and in accordance with the purpose of the invention, as embodied and broadly described herein, the process of the invention for encapsulating photocells comprises positioning photocells connected to one another by conducting wires into a space between a support plate and a second protective plate, and casting a resin into the space. The resin is obtained by mixing 100 parts of the above-described acrylic prepolymer containing 10 to 50% by weight of units derived from at least one alkyl acrylate, 30 to 60% by weight of units derived from at least one alkyl methacrylate, and 10 to 40% by weight of units derived from methyl acrylate, with 0.1 to 4 parts of a vanadium arenesulphonate and from 0.5 to 4 parts of a free-radical initiator at a temperature between 10° and 70° C. and for a sufficient time for the polymeric resin to solidify.

Still further to achieve the foregoing objects and in accordance with the purpose of the invention, as embodied and broadly described herein, the invention comprises encapsulated photocells made by the above-described casting process using the acrylic prepolymer of the present invention.

DESCRIPTION OF THE PREFERRED EMBODIMENTS

Reference will now be made in detail to the presently preferred embodiments of the invention.

The prepolymer according to the invention is a liquid that preferably has a density, at 20° C., of between 0.960 and 0.975 and a refractive index of between 1.43 and 1.44. It can also contain from 20 to 200 ppm (parts per million) of a polymerization inhibitor.

The process for the manufacture of the prepolymer according to the invention comprises copolymerizing (a) from 10 to 50% by weight of at least one alkyl acrylate, the alkyl group having from 4 to 12 carbon atoms, (b) from 30 to 60% by weight of at least one alkyl methacrylate, the alkyl group having from 1 to 5 carbon atoms, and (c) from 10 to 40% by weight of methyl acrylate, in the presence of a free-radical initiator and a chain transfer agent, at a temperature between 60° and 85° C., until a viscosity of between 1.5 and 10 poises is obtained. An example of a chain transfer agent that can be used is a mercaptan, such as laurylmercaptan, in an amount of 0.1 to 1% by weight, relative to all the comonomers. Examples of free-radical initiators that can be used are an azo compound or a peroxide, such as lauryl peroxide, in an amount of 0.2 to 2% by weight, relative to all the comonomers. If appropriate, the manufacture of the prepolymer according to the invention can be carried out in the presence of a crosslinking agent—such as, for example, triethylene glycol diacrylate or methylacrylate, ethylene glycol dimethacrylate or butanediol diacrylate—and/or of at least one fourth comonomers selected from the group consisting of acrylic acid, methacrylic acid, and ethylene glycol monomethacrylate.

A valuable application of the prepolymer according to the invention is for encapsulating photocells in a flexible and transparent resin obtained by mixing:

100 parts of the prepolymer described above, from 0.1 to 4 parts of a vanadium arenesulphonate, and from 0.5 to 4 parts of a free-radical initiator, at a temperature between 10° and 70° C. and for a sufficient time to obtain solidification of the polymeric resin at the temperature used. A mixing time between 1 and 24 hours is preferred.

The resin thus obtained preferably has a density, at 20° C., of between 1.10 and 1.12, a refractive index (determined according to ISO Standard Specification R 489) of between 1.47 and 1.48, and a Shore A hardness (determined according to ISO Standard Specification R 868) of between 20 and 35. It is characterized by a remarkable resistance to atmospheric agents and in particular to aging under the action of heat and/or moisture.

The vanadium arenesulphonate used in admixture with the prepolymer can be dispersed beforehand in a diluent such as, for example, methyl phthalate. The free-radical initiator can be selected from peroxides and peresters that can be decomposed at the selected temperature, such as, for example, methyl ethyl ketone peroxide, cyclohexanone peroxide, acetylacetone peroxide, tert-butyl hydroperoxide, butyl isopropyl peroxycarbonate, tert-butyl peroctoate, and the like. The time required to obtain solidification of the polymer generally varies from 1 to 24 hours, depending on the temperature in question.

In this preferred use of the prepolymer according to the invention, the photocells, connected to one another by conducting wires, are generally positioned first on a support plate. The mixture described above is then cast into the space located between the support plate and a second protective plate, which space can have a size on the order of 1 to 10 mm, and the whole device is kept in a chamber at the desired temperature for the required time. The plates delimiting the space into which the mixture is cast can be made of various materials such as glass, metal, or a synthetic resin such as polymethyl methacrylate. This results in a perfectly secure encapsulation of the photocells supplying the panels intended for utilizing solar energy.

The examples which follow illustrate embodiments of the present invention without implying a limitation.

Example 1—Manufacture of the Acrylic Prepolymer

A mixture of monomers, consisting of 31% by weight of 2-ethylhexyl acrylate, 47% by weight of ethylmethacrylate, and 22% by weight of methyl acrylate, was prepolymerized in the presence of 0.4% of laurylmercaptan and 0.2% of lauryl peroxide. This reaction was carried out at a temperature of 75° C. for a period of 90 minutes.

The prepolymer obtained was stabilized with the aid of 40 ppm of an inhibitor marketed under the name Topanol A.

The prepolymer obtained was characterized by the following physical properties:

Refractive index (ISO Standard Specification R 489): 1.435

Density at 20° C. (ISO Standard Specification 11-83): 0.968

Viscosity: 1.7 poises.

Example 2—Use of the Prepolymer for Encapsulation

Photocells were positioned on a support plate, and a 3 mm thick layer of a mixture consisting of:
 100 parts by weight of the prepolymer obtained according to Example 1,
 2 parts by weight of a mixture of cyclohexanone peroxide and tert-butyl peroctoate, in solution in methyl phthalate, and
 2 parts by weight of vanadyl toluenesulphonate in solution in methyl phthalate,
was then cast in the space located between the support plate and a second protective plate.

The mixture was kept in this space at a temperature of 20° C. for 24 hours. When this time had elapsed, the photocells were encapsulated in a solid polymer, the properties of which are described below.

Example 3—Properties of the Polymer

Immediate sampling of the polymer obtained by casting according to Example 2 made it possible to determine the following physical properties:

Refractive index
(ISO Standard Specification R 489): 1.475

Density at 20° C.
(ISO Standard Specification 11-83): 1.11

Shore A hardness
(ISO Standard Specification ISO R 868): 28

Flexibility: 148 seconds.

The flexibility was measured by compression on a tensile tester, the indicated value being the time in seconds taken to compress the test-piece up to a load of 40 kg at a rate of 1.5 mm/minute.

Furthermore, the polymer was subjected to an aging test in an air-conditioned chamber filled with hot air (50° C.) having a moisture content of 50%. The light transmission, measured after a residence time of 20 days in this chamber, was 94%. The polymer was also subjected to an aging test in water, by immersing it in a tank of hot water (50° C.). The flexibility, measured after a residence time of 20 days in this tank, was 148 seconds. It can therefore be noted that the polymer possesses good resistance to aging under the action of agents such as heat and moisture.

It will be apparent to those skilled in the art that various modifications and variations could be made in the invention without departing from the scope or spirit of the invention.

What is claimed is:

1. An acrylic prepolymer comprising:
 from 10 to 50% by weight of units derived from at least one alkyl acrylate, the alkyl group having from 4 to 12 carbon atoms,
 from 30 to 60% by weight of units derived from at least one alkyl methacrylate, the alkyl group having from 1 to 5 carbon atoms, and
 from 10 to 40% by weight of units derived from methyl acrylate.

2. A prepolymer according to claim 1, possessing a density at 20° C. between 0.960 and 0.975.

3. A prepolymer according to claim 1 or 2, possessing a refractive index between 1.43 and 1.44.

4. A prepolymer according to claim 1, further comprising from 20 to 200 ppm of a polymerization inhibitor.

5. A prepolymer according to claim 1 or 4, further comprising units derived from a fourth comonomer selected from the group consisting of acrylic acid, methyacrylic acid, and ethylene glycol monomethacrylate.

6. A process for the manufacture of the acrylic prepolymer according to claim 1, comprising copolymerizing (a) from 10 to 50% by weight of at least one alkyl acrylate, the alkyl group having from 4 to 12 carbon atoms, (b) from 30 to 60% by weight of at least one alkyl methacrylate, the alkyl group having from 1 to 5 carbon atoms, and (c) from 10 to 40% by weight of methyl acrylate in the presence of a free-radical initiator and a chain transfer agent, at a temperature between 60° and 85° C., until a viscosity of between 1.5 and 10 poises is obtained.

* * * * *

UNITED STATES PATENT AND TRADEMARK OFFICE
CERTIFICATE OF CORRECTION

PATENT NO. : 4,424,137
DATED : January 3, 1984
INVENTOR(S) : MICHEL AVENEL ET AL It is certified that error appears in the above—identified patent and that said Letters Patent is hereby corrected as shown below:

Column 4, Claim 5, lines 3 and 4, change "methyacrylic" to

--methacrylic--.

Signed and Sealed this

Tenth Day of April 1984

[SEAL]

Attest:

GERALD J. MOSSINGHOFF

Attesting Officer

Commissioner of Patents and Trademarks